United States Patent [19]
Jordan et al.

[11] Patent Number: 6,060,933
[45] Date of Patent: May 9, 2000

[54] ELECTRONIC VERNIER SYSTEMS AND METHODS

[75] Inventors: Edward P. Jordan; Royal A. Gosser, both of Greensboro, N.C.

[73] Assignee: Analog Devices, Inc., Norwood, Mass.

[21] Appl. No.: 09/112,038

[22] Filed: Jul. 8, 1998

[51] Int. Cl.[7] ............................... H03G 3/00; H03K 5/08
[52] U.S. Cl. ..................... 327/308; 327/306; 327/404; 333/81 R
[58] Field of Search ..................................... 327/308, 306, 327/560, 350, 179, 403, 405, 478; 330/278, 279, 288, 294, 86, 154; 333/81 R, 81 A, 81 B

[56] References Cited

U.S. PATENT DOCUMENTS 4,045,746  8/1977  Wheatley, Jr. ............................ 330/288
5,757,220  5/1998  Murden et al. ........................... 327/308
5,872,475  2/1999  Otaka ...................................... 327/308

*Primary Examiner*—Dinh T. Le
*Attorney, Agent, or Firm*—Koppel & Jacobs

[57] ABSTRACT

An electronic vernier realizes programmable gain steps with first and second impedance ladders, a plurality of activatable coupling networks and a switch network. The ladders receive and progressively process the differential input signal into a plurality of progressive differential signals. In an embodiment, the coupling networks each generate a respective one of a plurality of progressive differential output signals in response to a respective one of the progressive differential signals and the switch network activates any selected one of the coupling networks. Thus, any selected vernier step is obtained by activating the respective coupling network. The verniers can be integrated into various systems, e.g., programmable amplifiers.

20 Claims, 3 Drawing Sheets

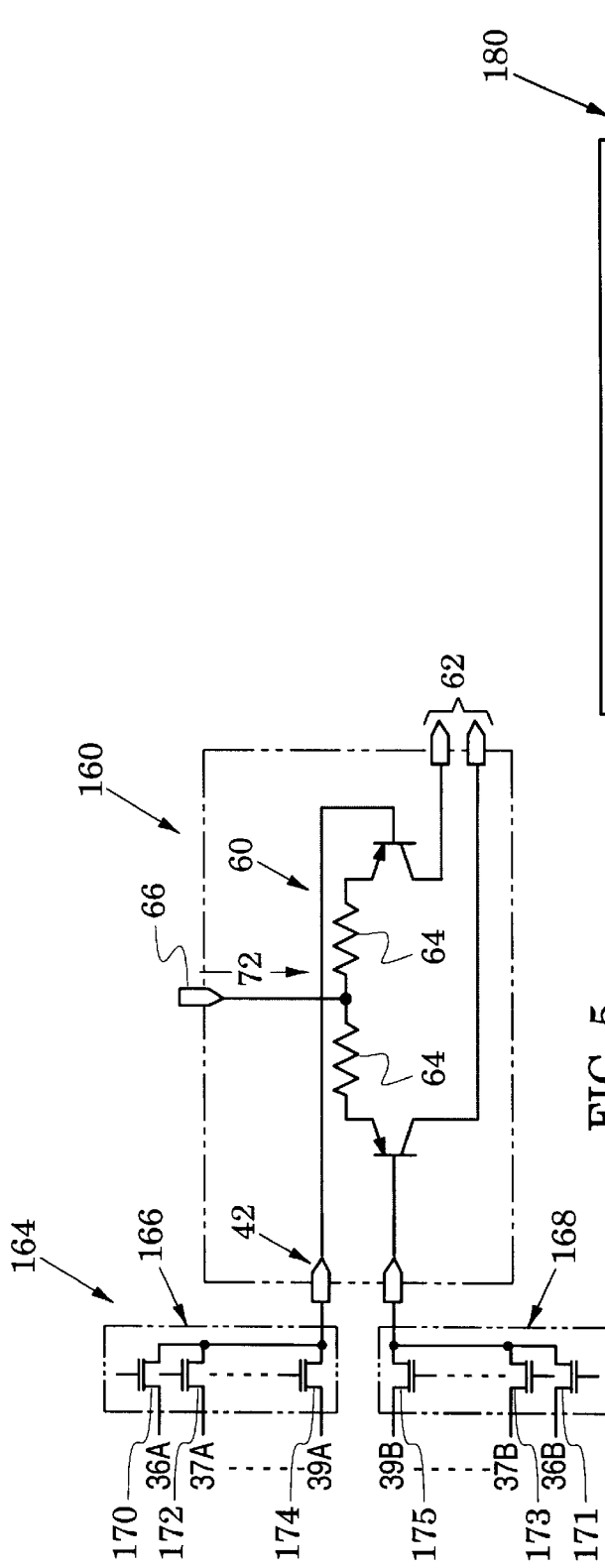

ELECTRONIC VERNIER SYSTEMS AND METHODS

BACKGROUND OF THE INVENTION

1. Field of the Invention

The present invention relates generally to programmable attenuators and amplifiers.

2. Description of the Related Art

Programmable gain devices (e.g., programmable attenuators and amplifiers) find use in numerous systems such as receivers, signal processors and digital-to-analog converters.

An exemplary teaching of programmable attenuators is found in U.S. Pat. No. 5,757,220 (which issued May 26, 1998 to Franklin M. Murden, et al. and was assigned to Analog Devices, Inc., the assignee of the present invention). It describes an attenuator that comprises an R-2R ladder network, a plurality of unity-gain, digitally-switched voltage-to-voltage buffers and a fixed gain stage that sets the attenuator's overall gain/attenuation.

The buffers have digital inputs that respond to binary voltage signals to turn them on and off. In general, only one buffer is turned on at a time so that an attenuated signal at its tap point (on the ladder network) is switched through to the fixed gain stage while the other buffers are held off. In disclosed programmable attenuator embodiments, each buffer has a first stage that remains on with unity gain and a second stage is switched on and off in response to a binary code. The unity gain buffers maintain an approximately constant input impedance whether they are turned on or off and this enhances phase matching over a wide range of signal frequency and power.

Although this attenuator structure is directed to tight phase matching between attenuated signals, it requires numerous complex stages (e.g., a plurality of multi-stage buffers in addition to a fixed gain stage) and fails to take advantage of the benefits of differential signal processing.

SUMMARY OF THE INVENTION

The present invention is directed to inexpensive vernier systems and methods that can receive differential signals and differentially process them with simple circuits that facilitate size reduction and enhance process matching in integrated circuit fabrication.

These goals are realized with first and second impedance ladders, a plurality of activatable differential coupling networks and a switch network. The ladders receive and progressively process the differential input signal into a plurality of progressive differential signals. The coupling networks each generate a respective one of a plurality of progressive differential output signals in response to a respective one of the progressive differential signals and the switch network activates any selected one of the coupling networks.

The ladders and switch network can be simply realized in various transistor families and because the coupling networks are differentially arranged, only one coupling network is required for each vernier step. When realized as an integrated circuit, this simplicity leads to a size reduction that facilitates improved matching characteristics. In addition, the differential structure realizes the advantages of differential processing (e.g., common-mode signal rejection and power supply transient suppression).

In a vernier embodiment, the ladders are configured in accordance with a logarithmic progression, the coupling networks are formed by a differential pair of transistors and the activating switch network includes a transistor switch in each coupling network. Each differential pair delivers an output current which is received in differential resistors at a vernier output port. In another vernier embodiment, one of the coupling networks is selectively connected to differential tap points of the ladders by activatable switch pairs.

Although embodiments of the invention are primarily illustrated with reference to bipolar transistors, the teachings of the invention can be practiced with different device families (e.g., field-effect transistors) or with mixed families.

Vernier methods of the invention include a first step in which a differential input signal is processed into a plurality of progressive differential signals. For each of the progressive differential signals, the capability is provided in a second process step for differential generation of a respective one of a plurality of progressive differential output signals. In a final process step, the generation of any selected one of the progressive differential output signals is commanded.

The novel features of the invention are set forth with particularity in the appended claims. The invention will be best understood from the following description when read in conjunction with the accompanying drawings.

BRIEF DESCRIPTION OF THE DRAWINGS

FIG. 5 is a schematic diagram of a coupling network and switch network for another vernier embodiment of the present invention; and FIG. 6 is a flow diagram which illustrates process steps of verniers of the invention.

DETAILED DESCRIPTION OF THE PREFERRED EMBODIMENTS

Verniers are programmable gain devices. In a positive gain embodiment, they are often referred to as programmable amplifiers and they are typically referred to as programmable attenuators in a negative gain embodiment.

Figure 1:
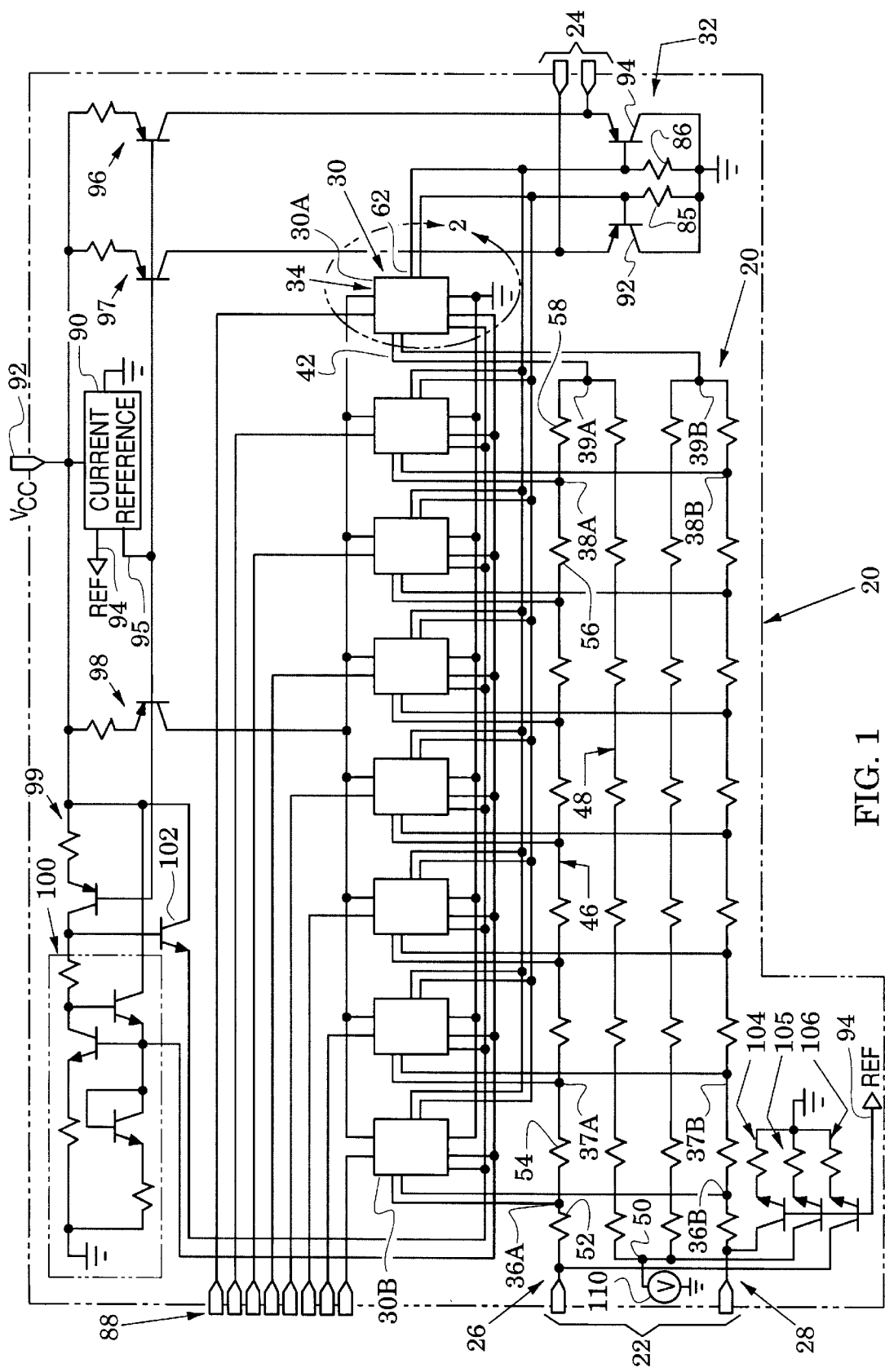
FIG. 1 is a schematic diagram of a vernier embodiment of the present invention.
Figure 2:
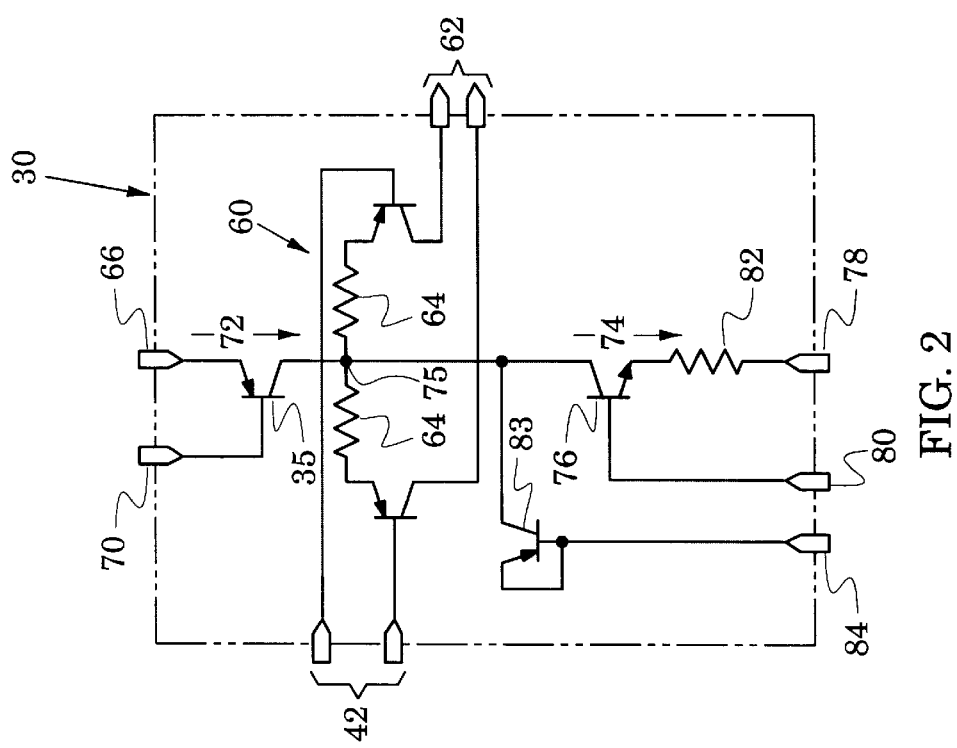
FIG. 2 is an enlarged schematic diagram of a coupling network that is enclosed in the curved line 2 of FIG. 1.

FIGS. 1 and 2 illustrate an electronic vernier 20 that has an input port 22 and an output port 24 and that can partition a differential input signal at the input port into a plurality of selectable progressive differential output signals at the output port. The term progressive refers to the fact that the differential output signals are in accordance with a progression (i.e., a sequence of signals in which each is related to a predecessor by a uniform law such as a linear law or a logarithmic law).

In particular, the vernier 20 of FIGS. 1 and 2 includes first and second impedance ladders 26 and 28, a plurality of activatable differential coupling networks 30 (detailed in FIG. 2), and a differential output circuit 32 wherein the coupling networks 30 include switches 35 (see FIG. 2) that together form a switch network 34 that activates any selected one of the coupling networks that activates any selected one of the coupling networks. In the vernier embodiment 20, the switch network includes a current switch 35 that is positioned in each of the coupling networks 30 as shown in FIG. 2.

In operation of the vernier, the ladders 26 and 28 differentially process an input signal at the input port 22 into progressive differential signals that appear at differential ladder tap points such as exemplary tap points 36A and 36B, 37A and 37B and so on to 38A and 38B and 39A and 39B.

The ladder tap points are connected to the differential input ports 42 of the coupling networks 30. In response to its respective one of the progressive differential signals, each of the coupling networks 30 generates a progressive differential output signal across the output circuit 32 when that coupling network is activated. Finally, it is the switch network 34 (in particular, the switches 35 of each coupling network 30 as shown in FIG. 2) that is configured to activate any selected one of the coupling networks. Thus, any of the progressive differential output signals can be commanded to appear at the output circuit 32.

Having briefly described its operation, attention is now directed to details of the vernier embodiment 20. The first and second impedance ladders 26 and 28 are formed with serially-connected resistor strings. The resistors are arranged so that the resistor string of the ladder 26 is divided into a first leg 46 that extends from one side of the differential input port 22 to the tap point 39A and a second leg 48 that extends from the tap point 39A to a center point 50 where the ladders 26 and 28 join. The ladder 28 is identically formed and extends from the other side of the input port 22 to the center point 50.

Selection of the resistors of the impedance ladder embodiment can be described with reference to an exemplary configuration in which it is desired that the voltage signals at the ladder tap points are in accordance with a logarithmic progression. In this exemplary configuration, it is further desired to generate eight progressive differential output signals at the output port 24 that will span an approximately 6 dB signal region (in this and the following descriptions, a statement that a ratio x has a value of y dB or of y dBV is an assertion that y=20logx).

Accordingly, each resistor in the first leg 46 has a resistance that is approximately 0.75 dB (6 dB divided by eight) different than the resistance of its neighbor. For example, at one end of the leg 46 the resistance of the resistor 54 is 0.75 dB less than that of resistor 52 and at the other leg end the resistance of the resistor 58 is 0.75 dB less than that of resistor 56. Because of the 6 dB design goal, the total resistance of the second leg 48 is identical to that of the first leg 46. In accordance with standard integrated circuit fabrication policy, this is preferably realized by forming each resistor of the second leg 48 to be identical to a corresponding resistor (shown above it in FIG. 1) in the first leg 46.

The resistors of the ladders 26 and 28 are inevitably accompanied by some stray capacitance. Accordingly, in higher frequency applications of the teachings of the invention, the values of the ladder resistors should be kept small to enhance the processing speed of the ladder structure. In such applications, for example, the resistor values are preferably less than 100 ohms and, more preferably, less than 30 ohms.

In this ladder embodiment, a signal at tap point 36A will be approximately 0.75 dBV below that at the upper side of the input port 22 and this order is maintained down to tap point 39A where the voltage will be approximately 6 dBV below that at the input port. Because the ladder 28 is configured identical to the ladder 26, signals at its tap points will follow the same logarithmic progression.

In the illustrated embodiment of FIG. 2, coupling network 30 is realized with bipolar transistors. A differential pair 60 of transistors has its bases coupled to the input port 42 and its collectors coupled to an output port 62. The linearity of the gain of the differential pair is improved by degeneration resistors 64 that are positioned in the emitters and which are connected to a current supply port 66 by a transistor switch 35. The switch is controlled by signals at a command port 70 that connects to the transistor base.

In its on state, the switch 35 supplies an activation current 72 to the differential pair. In its off state, it is preferred that a discharge current 74 flow from the node 75 between emitter degeneration resistors 64 to remove electric charge buildup on stray capacitances. Accordingly, transistor 76 is arranged to couple such a current to a discharge port 78. This transistor's base is biased via a bias port 80 and its current is set with an emitter resistor 82. A diode-connected transistor 83 is arranged between a clamp port 84 and the node 75. This transistor insures that the collector of transistor 76 does not drop into saturation and also supplies the current 74 after all electric charges have been swept away from the node 75.

Each of the coupling networks is activated by application of an appropriate command (e.g., a low voltage) at the command port 70 which causes the switch 35 to couple the current 72 to the differential pair 60. Each coupling network is deactivated by application of an appropriate command (e.g., a high voltage) at the command port 70 which causes the switch 35 to cease conducting the current 72.

When the coupling network 30 of FIG. 2 is activated, a differential signal (e.g., a differential voltage from the first and second ladders (26 and 28 in FIG. 1) initiates a differential current signal in the collectors of the differential pair and this differential current flows in FIG. 1 through first and second output resistors 85 and 86 in the output circuit 32. Thus, a respective one of the progressive differential output signals appears in the form of a differential voltage across the resistors 85 and 86. The progressive differential output signal can be turned on and off by activating and deactivating its respective coupling network 30.

The ratio (i.e., coupling gain) of each progressive differential output signal to its respective progressive differential signal at the input port (42 in FIG. 2) is approximately given by $R85/(r_e+R64)$ in which $r_e$ is the small signal emitter resistance of one of the differential pair transistors, R64 is one of the degenerating resistors of FIG. 2 and R85 is one of the output resistors of FIG. 1.

The output port 24 of the vernier 20 of FIG. 1 is preferably driven by buffer amplifiers. In FIG. 1, for example, emitter followers 92 and 94 connect the differential resistors 85 and 86 to the differential output port 24. The vernier also includes a plurality of command input ports 88 that are each connected with the command port (70 in FIG. 2) of a respective one of the coupling networks 30.

In operation of the vernier 20 of FIG. 1, each of the coupling circuits 30 can be selectively activated with a signal at its command input port and, as a result, its respective progressive differential output signal appears at the output port 24. Because the coupling networks 30 all have substantially the same coupling gain, the progressive differential output signals will be in accordance with the same progression law as the progressive differential signals at the ladder tap points. The coupling gain represents a shift in signal level but not a change in the progression law.

The vernier 20 also has a master current reference 90 that is coupled to a $V_{CC}$ port 92 and supplies two current reference signals 94 and 95. Current mirrors 96, 97, 98 and 99 mirror the current associated with the reference signal 95.

Current mirrors 96 and 97 supply current to the emitter followers 92 and 94 while current mirror 98 supplies current to the coupling networks 30.

A $V_{BE}$-referenced bias 100 is coupled between the current mirror 99 and the bias port (80 in FIG. 2) of each of the coupling networks 30. A transistor 102 senses a voltage at the top of the bias 100 and passes it to the clamp port (84 in FIG. 2) of each of the coupling networks 30. Current mirrors 104, 105 and 106 mirror the current associated with the reference signal 94. Current mirrors 104 and 106 pull current from input ends of the ladders 26 and 28 and current mirror 105 pulls current from the center point 50. Vernier operation is enhanced by the presence of a signal ground at the center point 50 and this may be provided by various conventional structures, e.g., the voltage source 110 of FIG. 1.

Figure 3:
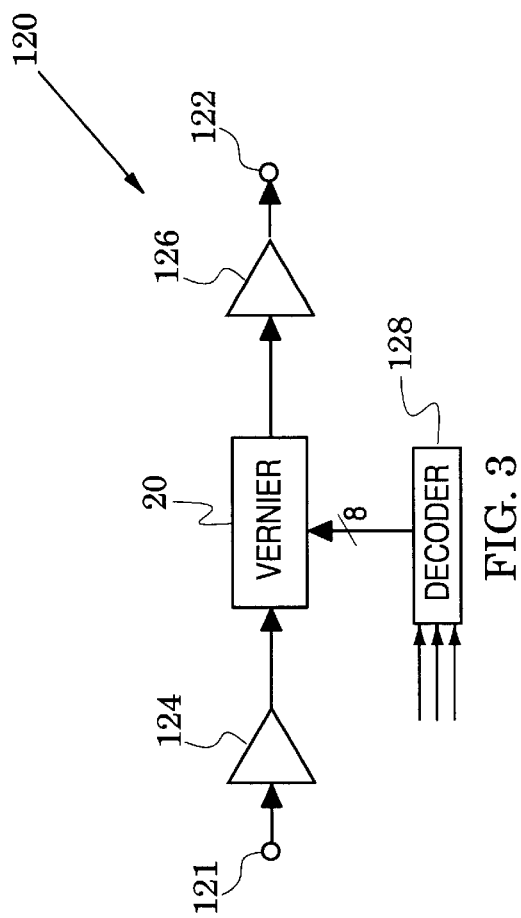
FIG. 3 is a block diagram of a programmable amplifier that includes the vernier of FIG. 1.

The vernier 20 can be used in a variety of gain applications. An exemplary one is illustrated by the programmable amplifier system 120 of FIG. 3 which can generate selectable gain between a system input 121 and a system output 122. In this system, the vernier 20 is positioned between gain devices in the form of a preamplifier 124 and a postamplifier 126. A decoder 128 receives three input signals and, in response, delivers any selected one of eight command signals to the vernier 20.

Figure 4:
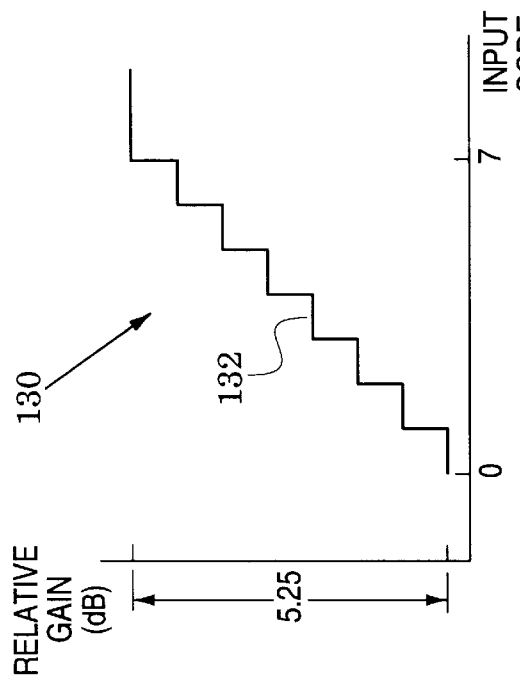
FIG. 4 is a diagram of relative gain versus a gain command code in the programmable amplifier of FIG. 3.

The system gain between the input 121 and the output 122 can therefore be programmable adjusted over the eight gain steps 132 that are shown in the gain diagram 130 of FIG. 4. With the exemplary ladder structure that was described above, each gain step is spaced from its neighbors by 0.75 dB and the vernier can selectively step the gain of the programmable amplifier 120 over a total range of 5.25 dB. Although the gain devices 121 and 122 of FIG. 3 generate fixed positive gain, other gain systems can be formed by combining the verniers of the invention with different gain devices (e.g., negative-gain devices and variable-gain devices).

In the vernier 20 of FIG. 1, the coupling network 30 and the switch network 34 cooperatively generate, from each of the progressive differential signals of the ladders 26 and 28, a selectable and respective one of a plurality of progressive differential output signals. This cooperative generation can be realized in various embodiments of the invention. For example, FIG. 5 shows a differential coupling network 160 that is similar to the coupling network 30 of FIG. 2 with like elements indicated by like reference numbers.

FIG. 5 also shows a switch network 164 that has a first set 166 of field-effect transistor switches and a second set 168 of field-effect transistor switches (e.g., as exemplified in the figure by metal-oxide transistor switches). Each switch pair that is selected from the sets 166 and 168 is coupled to a respective one of the differential ladder tap points of FIG. 1. For example, the switch pair 170 and 171 is coupled to the differential ladder tap point 36A and 36B, the switch pair 172 and 173 is coupled to the differential ladder tap point 37A and 37B and so on to the switch pair 174 and 175 which is coupled to the differential ladder tap point 39A and 39B.

In operation, activation of any switch pair presents one of the progressive differential signals of the ladders 26 and 28 to the coupling network 60 which, in response, generates a respective one of the progressive differential output signals. Switch pairs are selectively activated in this embodiment rather than the coupling network. Accordingly, the coupling network 160 does not require other transistors (e.g., transistors 35, 76 and 83) of the network 30 of FIG. 2.

The vernier processes of the invention are summarized in the flow chart 180 of FIG. 6. In a first step 182, a differential input signal is processed into a plurality of progressive differential signals. For each of the progressive differential signals, the capability is provided in step 184 for differential generation of a respective one of a plurality of progressive differential output signals.

In a final step 186, the generation of any selected one of the progressive differential output signals is commanded. In the vernier embodiment of FIG. 1, this command is realized by selection of an appropriate switch (35 in FIG. 2) that activates one of the coupling networks 30. In the vernier embodiment of FIG. 5, this command is realized by activation of an appropriate switch pair that couples the coupling network 160 to a selected differential tap point.

Compared to conventional verniers, those of the invention can be realized with a small number of elements which reduces their size and cost and facilitates their realization in a variety of fabrication techniques (e.g., integrated circuit fabrication). Because the coupling networks are differentially arranged, only one coupling network is required for each vernier step and the differential structure realizes the advantages of differential processing (e.g., common-mode signal rejection and power supply transient suppression). Other vernier embodiments require only a single coupling network for all vernier steps. The reduced size and cost of these verniers makes them attractive for integration into various systems (e.g., multiplying digital-to-analog converters).

The term gain has been used to describe verniers of the invention. Gain is often expressed in decibels and may indicate an increase or a decrease in signal amplitude. Increases and decreases are typically respectively expressed as positive and negative values. Although these verniers may be configured as programmable attenuators, they may also be configured with positive gain as programmable amplifiers.

The vernier 20 has been illustrated with bipolar transistors but other verniers of the invention can be formed with different device families (e.g., field-effect transistors) or with mixed families. Although the coupling networks 30 have been exemplified in FIG. 2 as transconductance stages that generate a differential current in response to a differential voltage signal, the teachings of the invention can be practiced with differential networks having other transfer functions (e.g., $v_{out}/v_{in}$). In addition, the switch network 34 can be realized with a variety of activating switch arrangements in addition to the one exemplified by the switches 35 of FIG. 2.

The vernier 20 of FIG. 1 has been structured in accordance with a logarithmic progression but other vernier structures can be realized in accordance with a variety of progressions (e.g., a linear progression or an exponential progression). Although resistive ladders 26 and 28 have been shown in FIG. 1, the teachings of the invention can be practiced with other differential impedance ladders.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An electronic vernier for processing a differential input signal into a plurality of progressive differential output signals, comprising:

first and second impedance ladders that differentially receive and progressively process said differential input signal into a plurality of progressive differential signals;

an output circuit having differential output terminals;

a plurality of activatable differential coupling networks that each differentially receives a respective one of said progressive differential signals and differentially couples it across said output circuit to form a respective one of said progressive differential output signals at said differential output terminals; and wherein each of said plurality of activatable differential coupling networks comprises a switch network that activates said each of said coupling networks.

2. The vernier of claim 1, wherein said first and second impedance ladders each include a serially-connected string of resistors and all of said resistors have a resistance less than 100 ohms to enhance the processing speed of said ladders.

3. The vernier of claim 1, wherein said first and second impedance ladders each include a serially-connected string of resistors and each adjacent pair of said resistors has a substantially constant ratio.

4. The vernier of claim 1, wherein each of said coupling networks has a coupling gain represented by a ratio of a respective one of said progressive differential output signals to a respective one of said progressive differential signals, and wherein each of said coupling networks has substantially the same coupling gain.

5. The vernier of claim 1, wherein each of said coupling networks generates a differential current signal in response to a respective one of said progressive differential signals and said output circuit comprises first and second resistors that differentially receive said differential current signal to generate said progressive differential output signals.

6. The vernier of claim 1, wherein each of said coupling networks includes a differential pair of transistors that is activated by an activation current and wherein said switch network includes a plurality of switches that each supply a respective one of said coupling networks with said activation current.

7. The vernier of claim 6, wherein said output circuit includes a first resistor that is driven by one transistor of said differential pair and a second resistor that is driven by the other transistor of said differential pair to generate said progressive differential output signals.

8. The vernier of claim 7, wherein said output circuit further includes first and second emitter followers that are respectively coupled to said first and second resistors.

9. The vernier of claim 1, wherein said ladders include resistors that are related by a logarithmic progression.

10. A programmable gain system, comprising:

at least one programmable gain device having device gain steps; and an electronic vernier which is coupled in series with said programmable gain device to receive a differential input signal, said vernier including:

a) first and second impedance ladders that differentially receive and progressively process said differential input signal into a plurality of progressive differential signals;

b) an output circuit having differential output terminals;

c) a plurality of activatable differential coupling networks that each differentially receives a respective one of said progressive differential signals and differentially couples it across said output circuit to form a respective one of a plurality of progressive differential output signals at said differential output terminals; and wherein each of said plurality of activatable differential coupling networks comprises d) a switch network that activates said each of said coupling networks;

said progressive differential output signals forming vernier gain steps that are sized to span any one of said device gain steps.

11. The programmable gain system of claim 10, wherein said first and second impedance ladders each include a serially-connected string of resistors and all of said resistors have a resistance less than 100 ohms to enhance the processing speed of said ladders.

12. The programmable gain system of claim 10, wherein said first and second impedance ladders each include a serially-connected string of resistors and an impedance ratio of each adjacent pair of said resistors is substantially constant.

13. The programmable gain system of claim 10, wherein each of said coupling networks has a coupling gain represented by a ratio of a respective one of said progressive differential output signals to a respective one of said progressive differential signals, and wherein each of said coupling networks has substantially the same coupling gain.

14. The programmable gain system of claim 10, wherein each of said coupling networks generates a differential current signal in response to a respective one of said progressive differential signals and said output circuit includes first and second resistors that differentially receive said differential current signal to generate said progressive differential output signals.

15. The programmable gain system of claim 10, wherein each of said coupling networks includes a differential pair of transistors that is activated by an activation current and wherein said switch network includes a plurality of switches that are each associated with a respective one of said coupling networks and arranged to supply said activation current.

16. The programmable gain system of claim 15, wherein said output circuit includes a first resistor that is driven by one transistor of said differential pair and a second resistor that is driven by the other transistor of said differential pair to generate said progressive differential output signals.

17. A method for processing a differential input signal into a plurality of progressive differential output signals, comprising the steps of:

receiving said differential input signal with first and second impedance ladders to form a plurality of progressive differential signals;

activating any one of a plurality of coupling networks to select a respective one of said progressive differential signals; and in response to said activating step, differentially coupling said one of said progressive differential signals through first and second resistors of an output circuit to form a respective one of said progressive differential output signals at differential output terminals.

18. The method of claim 17, wherein signals along said ladders represent said progressive differential signals.

19. The method of claim 17, further including the step of forming said first and second impedance ladders so that each of said progressive differential output signals has a substantially constant ratio with a respective one of said progressive differential signals.

20. The method of claim 17, wherein amplitudes of said progressive differential signals and said progressive differential output signals are related by a logarithmic progression.

* * * * *